(12) United States Patent
Friend et al.

(10) Patent No.: US 7,998,386 B2
(45) Date of Patent: Aug. 16, 2011

(54) MULTILAYERED POLYMERIC STRUCTURE

(75) Inventors: Stephen O. Friend, Middletown, MA (US); Edward W. S. Bryant, Longmont, CO (US); Harold C. Fowler, Midland, MI (US)

(73) Assignee: Hyperion Catalysis International, Inc., Cambridge, MA (US)

( * ) Notice: Subject to any disclaimer, the term of this patent is extended or adjusted under 35 U.S.C. 154(b) by 229 days.

(21) Appl. No.: 11/841,626

(22) Filed: Aug. 20, 2007

(65) Prior Publication Data
US 2009/0283196 A1    Nov. 19, 2009

Related U.S. Application Data

(60) Division of application No. 10/988,711, filed on Nov. 15, 2004, now abandoned, which is a continuation of application No. 09/882,464, filed on Jun. 14, 2001, now Pat. No. 6,949,159, which is a continuation-in-part of application No. 09/593,781, filed on Jun. 14, 2000, now abandoned.

(51) Int. Cl.
*B29C 65/00* (2006.01)

(52) U.S. Cl. .............................. 264/173.16; 264/171.1

(58) Field of Classification Search ............. 264/171.1, 264/173.16
See application file for complete search history.

(56) References Cited

U.S. PATENT DOCUMENTS

| | | | |
|---|---|---|---|
| 3,040,210 A | 6/1962 | Charlton et al. | |
| 4,154,344 A * | 5/1979 | Yenni et al. | 206/524.6 |
| 4,307,144 A * | 12/1981 | Sanders et al. | 442/38 |
| 4,414,260 A | 11/1983 | Rzepecki | |
| 4,540,624 A | 9/1985 | Cannady, Jr. | |
| 4,648,508 A * | 3/1987 | Neal et al. | 206/524.2 |
| 4,663,230 A | 5/1987 | Tennent | |
| 4,777,351 A | 10/1988 | Batliwalla et al. | |
| 4,855,091 A | 8/1989 | Geus et al. | |
| 4,954,389 A * | 9/1990 | Acharya et al. | 428/212 |
| 4,988,775 A | 1/1991 | Sivavec et al. | |
| 5,132,365 A | 7/1992 | Gallucci | |
| 5,165,909 A | 11/1992 | Tennent et al. | |
| 5,171,560 A | 12/1992 | Tennent | |
| 5,456,897 A | 10/1995 | Moy et al. | |
| 5,500,200 A | 3/1996 | Mandeville et al. | |
| 5,569,635 A | 10/1996 | Moy et al. | |
| 5,591,382 A | 1/1997 | Nahass et al. | |
| 5,643,502 A | 7/1997 | Nahass et al. | |
| 5,651,922 A | 7/1997 | Nahass et al. | |

(Continued)

FOREIGN PATENT DOCUMENTS

| | | |
|---|---|---|
| CA | 2064041 A1 | 7/1990 |
| EP | 0381390 A2 | 8/1990 |
| EP | 0440939 A3 | 8/1991 |

(Continued)

OTHER PUBLICATIONS

International Search Report and attachments from corresponding PCT/US01/40978.

(Continued)

*Primary Examiner* — Joseph Del Sole
*Assistant Examiner* — Kimberly A Stewart

(57) ABSTRACT

A multilayered polymeric structure having at least two polymeric layers is provided, each layer being a mixture of a polymeric composition with carbon fibrils. The multilayer polymeric structure may include an electrically conductive material between the first and second polymeric layers. A process for making a multilayered polymeric structure for packaging electronic components is also provided. The multilayered polymeric material is used to form trays and packages for containing electrical components.

4 Claims, 4 Drawing Sheets

U.S. PATENT DOCUMENTS

| | | | |
|---|---|---|---|
| 5,707,916 | A | 1/1998 | Snyder et al. |
| 5,798,048 | A | 8/1998 | Ries |
| 5,908,585 | A | 6/1999 | Shibuta |
| 6,024,767 | A | 2/2000 | Telesca et al. |
| 6,143,689 | A | 11/2000 | Moy et al. |
| 6,149,848 | A * | 11/2000 | Makise et al. ................ 264/105 |
| 6,162,536 | A * | 12/2000 | Montsinger ................... 428/372 |

FOREIGN PATENT DOCUMENTS

| | | |
|---|---|---|
| EP | 0475040 A2 | 3/1992 |
| EP | 0516150 A1 | 12/1992 |
| JP | 61160489 | 7/1986 |
| JP | 11115985 | 4/1999 |

OTHER PUBLICATIONS

Baker and Harris, Chemistry and Physics of Carbon, Walker and Thrower ed., vol. 14, 1978, p. 83.

Iljima, S., "Helical microtubules of graphitic carbon," Nature 354:56-58 (1991).

Oberlin, A. & Endo, M., "Filamentous Growth of Carbon Through Benzene Decomposition," J. of Crystal Growth, vol. 32, pp. 335-349 (1976).

Rodriguez, N., "A Review of Catalytically Grown Carbon Nanofibers," J. Mater. Research, vol. 8, pp. 3233-3250 (1993).

Weaver, J.H., "Totally Tubular," Science 265, pp. 611-612 (1994).

* cited by examiner

MULTILAYERED POLYMERIC STRUCTURE

This application is a divisional of co-pending U.S. Ser. No. 10/988,711, filed Nov. 15, 2004, which is a continuation of U.S. Ser. No. 09/882,464 filed Jun. 14, 2001, now U.S. Pat. No. 6,949,159, which is a continuation in part of U.S. Ser. No. 09/593,781, filed Jun. 14, 2000, now abandoned, all of which are incorporated by reference herein in their entirety.

BACKGROUND OF THE INVENTION

1. Field of Invention

The invention relates generally to electrically conductive polymers and more particularly to antistatic and electrically protective packaging made of multilayered polymeric materials.

2. Description of the Related Art

Antistatic Materials

The sudden discharge of static electricity which may build on a sensitive electrical component often results in current flow through the component far exceeding its current carrying capacity. In order to protect and avoid the damage or destruction of such components, slow dissipation of the static charge from these components is crucial. For this reason, static-sensitive components are typically transported and stored on trays or in containers made of "antistatic" material having a very high resistance. The high resistance of the material allows electric charge to flow through the material only at very low current levels.

Static charges can also impact the quality of signals carried in cables. Static charges can induce or modify electrical fields affecting nearby electrical signals. Antistatic layers can be incorporated into signal cables to minimize effects of nearby static charges.

Antistatic materials used to transport or store static sensitive components are generally characterized by a uniform electrically conductive surface having resistance in the range of $1 \times 10^6$ to $1 \times 10^{10}$ ohms per square. Although polymers are generally nonconductive, sheets of polymeric compositions containing conductive impurities or additives may be made to conduct electricity, and may be used as antistatic materials. The additives discussed include but are not limited to metallic powders, metallic fibers, ionic conductive polymers, intrinsically conductive polymeric powder (e.g., polypyrrole), carbon fibers or carbon black.

Although prior art packages and trays made of polymeric material are suitable for dissipating electric charge from sensitive components, they do not protect the components from electric charge originating outside of the tray or package. If a conventional tray or package of the prior art comes in contact with a current source having sufficiently high voltage, electric current can flow through the tray or package, and through the components therein, damaging the components. Trays and packages made from the single layer polymeric materials of the prior art provide no means for shunting current away from the components, and therefore are not suitable for protecting components against charge emanating outside the tray or package. Further, the effectiveness of single layer materials of the prior art may be limited to specific ranges of voltage or frequency.

Carbon Nanotubes

This invention lies in the field of submicron graphitic carbon fibrils, sometimes called vapor grown carbon fibers or nanotubes. Carbon fibrils are vermicular carbon deposits having diameters less than $1.0\mu$, preferably less than $0.5\mu$, and even more preferably less than $0.2\mu$. They exist in a variety of forms and have been prepared through the catalytic decomposition of various carbon-containing gases at metal surfaces. Such vermicular carbon deposits have been observed almost since the advent of electron microscopy. (Baker and Harris, *Chemistry and Physics of Carbon*, Walker and Thrower ed., Vol. 14, 1978, p. 83; Rodriguez, N., *J. Mater. Research*, Vol. 8, p. 3233 (1993)).

In 1976, Endo et al. (see Oberlin, A. and Endo, M., *J. of Crystal Growth*, Vol. 32 (1976), pp. 335-349), hereby incorporated by reference, elucidated the basic mechanism by which such carbon fibrils grow. They were seen to originate from a metal catalyst particle, which, in the presence of a hydrocarbon containing gas, becomes supersaturated in carbon. A cylindrical ordered graphitic core is extruded which immediately, according to Endo et al., becomes coated with an outer layer of pyrolytically deposited graphite. These fibrils with a pyrolytic overcoat typically have diameters in excess of $0.1\mu$, more typically $0.2$ to $0.5\mu$.

In 1983, Tennent, U.S. Pat. No. 4,663,230, hereby incorporated by reference, describes carbon fibrils that are free of a continuous thermal carbon overcoat and have multiple graphitic outer layers that are substantially parallel to the fibril axis. As such they may be characterized as having their cylindrical axes, the axes which are perpendicular to the tangents of the curved layers of graphite, substantially perpendicular to their cylindrical axes. They generally have diameters no greater than $0.1\mu$ and length to diameter ratios of at least 5. Desirably they are substantially free of a continuous thermal carbon overcoat, i.e., pyrolytically deposited carbon resulting from thermal cracking of the gas feed used to prepare them. Thus, the Tennent invention provided access to smaller diameter fibrils, typically 35 to 700 Å ($0.0035$ to $0.070\mu$) and to an ordered, "as grown" graphitic surface. Fibrillar carbons of less perfect structure, but also without a pyrolytic carbon outer layer have also been grown.

The carbon nanotubes which can be oxidized as taught in this application, are distinguishable from commercially available continuous carbon fibers. In contrast to these fibers which have aspect ratios (L/D) of at least $10^4$ and often $10^6$ or more, carbon fibrils have desirably large, but unavoidably finite, aspect ratios. The diameter of continuous fibers is also far larger than that of fibrils, being always >$1.0\mu$ and typically 5 to $7\mu$.

Tennent, et al., U.S. Pat. No. 5,171,560, hereby incorporated by reference, describes carbon fibrils free of thermal overcoat and having graphitic layers substantially parallel to the fibril axes such that the projection of said layers on said fibril axes extends for a distance of at least two fibril diameters. Typically, such fibrils are substantially cylindrical, graphitic nanotubes of substantially constant diameter and comprise cylindrical graphitic sheets whose c-axes are substantially perpendicular to their cylindrical axis. They are substantially free of pyrolytically deposited carbon, have a diameter less than $0.1\mu$ and length to diameter ratio of greater than 5. These fibrils can be oxidized by the methods of the invention.

When the projection of the graphitic layers on the nanotube axis extends for a distance of less than two nanotube diameters, the carbon planes of the graphitic nanotube, in cross section, take on a herring bone appearance. These are termed fishbone fibrils. Geus, U.S. Pat. No. 4,855,091, hereby incorporated by reference, provides a procedure for preparation of fishbone fibrils substantially free of a pyrolytic overcoat. These carbon nanotubes are also useful in the practice of the invention.

Carbon nanotubes of a morphology similar to the catalytically grown fibrils described above have been grown in a high temperature carbon arc (Iijima, Nature, 354, 56, 1991). It is now generally accepted (Weaver, Science, 265, 1994) that these arc-grown nanofibers have the same morphology as the earlier catalytically grown fibrils of Tennent. Arc grown carbon nanofibers after colloquially referred to as "bucky tubes", are also useful in the invention.

Carbon nanotubes differ physically and chemically from continuous carbon fibers which are commercially available as reinforcement materials, and from other forms of carbon such as standard graphite and carbon black. Standard graphite, because of its structure, can undergo oxidation to almost complete saturation. Moreover, carbon black is amorphous carbon generally in the form of spheroidal particles having a graphene structure, carbon layers around a disordered nucleus. The differences make graphite and carbon black poor predictors of nanotube chemistry.

Aggregates of Carbon Nanotubes

As produced carbon nanotubes may be in the form of discrete nanotubes, aggregates of nanotubes or both.

Nanotubes are prepared as aggregates having various morphologies (as determined by scanning electron microscopy) in which they are randomly entangled with each other to form entangled balls of nanotubes resembling bird nests ("BN"); or as aggregates consisting of bundles of straight to slightly bent or kinked carbon nanotubes having substantially the same relative orientation, and having the appearance of combed yarn ("CY") e.g., the longitudinal axis of each nanotube (despite individual bends or kinks) extends in the same direction as that of the surrounding nanotubes in the bundles; or, as, aggregates consisting of straight to slightly bent or kinked nanotubes which are loosely entangled with each other to form an "open net" ("ON") structure. In open net structures the extent of nanotube entanglement is greater than observed in the combed yarn aggregates (in which the individual nanotubes have substantially the same relative orientation) but less than that of bird nest.

The morphology of the aggregate is controlled by the choice of catalyst support. Spherical supports grow nanotubes in all directions leading to the formation of bird nest aggregates. Combed yarn and open net aggregates are prepared using supports having one or more readily cleavable planar surfaces, e.g., an iron or iron-containing metal catalyst particle deposited on a support material having one or more readily cleavable surfaces and a surface area of at least 1 square meters per gram. Moy et al., U.S. application Ser. No. 08/469,430 entitled "Improved Methods and Catalysts for the Manufacture of Carbon Fibrils", filed Jun. 6, 1995, hereby incorporated by reference, describes nanotubes prepared as aggregates having various morphologies (as determined by scanning electron microscopy).

Further details regarding the formation of carbon nanotube or nanofiber aggregates may be found in the disclosure of U.S. Pat. No. 5,165,909 to Tennent; U.S. Pat. No. 5,456,897 to Moy et al.; Snyder et al., U.S. patent application Ser. No. 07/149,573, filed Jan. 28, 1988, and PCT Application No. US89/00322, filed Jan. 28, 1989 ("Carbon Fibrils") WO 89/07163, and Moy et al., U.S. patent application Ser. No. 413,837 filed Sep. 28, 1989 and PCT Application No. US90/ 05498, filed Sep. 27, 1990 ("Battery") WO 91/05089, and U.S. application Ser. No. 08/479,864 to Mandeville et al., filed Jun. 7, 1995 and U.S. application Ser. No. 08/284,917, filed Aug. 2, 1994 and U.S. application Ser. No. 08/320,564, filed Oct. 11, 1994 by Moy et al., all of which are assigned to the same assignee as the invention here and are hereby incorporated by reference.

OBJECTS OF THE INVENTION

It is therefore an object of the invention to provide an improved packaging material which will protect sensitive electric components from damage or destruction due to electrostatic discharge.

It is a further object of the invention to provide improved packages and carrying trays for electrical components.

It is a further object of the invention to provide improved shielding for signal carrying cables.

SUMMARY OF THE INVENTION

A packaging material is provided having multiple polymeric layers. Each layer comprises a mixture of a polymer and carbon fibrils. The multilayered material has an inner layer with a uniform surface resistance in the range of $1 \times 10^6$ ohms per square to $1 \times 10^{10}$ ohms per square, and an outer layer with a surface resistance lower than that of the inner layer. The inner and outer layers may be directly in contact with one another, or there may be intermediate layers of conductive material between them. Each intermediate layer could be made of any material having a surface resistance of at least $10^{10}$ ohms per square. The surface resistance of the packaging material varies from $10^{0.5}$ to $10^{10}$ ohms per square, preferably from $10^1$ to $10^8$ ohms per square.

In a two-layer polymeric structure, the first layer contains a polymer having 0.25% to 25% by weight of carbon fibrils. This concentration of fibrils provides the antistatic layer with a surface resistance in the range of $1 \times 10^6$ to $1 \times 10^{10}$ ohms per square. The second layer may contain 2% to 35% by weight of carbon fibrils, thereby providing a lower resistance relative to the first antistatic layer. Each polymeric layer can have a thickness from about 0.5 mils to about 175 mils and preferably from about 5 mils to about 30 mils. The entire multilayered polymeric structure can be of whatever thickness is desirable for a given application. For example, the structure of the invention can be from about 1 mil to about 250 mils, preferably from about 2 mils to about 100 mils and most preferably from about 10 mils to about 60 mils.

Once each of the polymeric compositions comprising the various layers of the invention are prepared, they are combined to form a composite multilayered material. If the separate layers of polymeric composition are allowed to cure prior to being joined, the combining process consists of applying heat and pressure which causes the separate layers to fuse together. It is, however, preferred that the separate layers of polymeric material are joined prior to curing. This may be accomplished via a coextrusion process, where two or more polymeric compositions are forced through a single aperture. The multilayered material produced by coextrusion may either be allowed to cure as a flat sheet, or may be placed into molds in the form of a desired end-product, i.e. a tray. Each polymeric layer can be processed according to any applicable kind of polymer processing, it being understood that the carbon fibril loading does not limit its processability.

As used herein to "cure" or "curing" refers to a process of conversion of raw or reactive polymer systems to a finished and useful condition usually by transfer of heat and/or application of chemicals which induce physical and/or chemical changes. Cooling of a molten polymeric composition into a solid layer or sheet is an example of curing. Another example of curing is the process of crosslinking a thermosetting product.

The polymeric material of the invention may be formed into any one of a number of shapes or configurations suitable for the transport and/or storage of sensitive electrical components, i.e. trays and packages. When the material of this invention is formed into a tray or package, the antistatic layer of the material is situated such that it faces the inside of the tray or package, and comes directly in contact with the component. A more conductive polymeric layer of the material forms the outside surface of the tray or package.

An advantage of having the outer layer of the multilayered material more conductive than the inside antistatic layer is that the outer layer acts as a shunt for any electric current originating outside of a tray or package made of the material. Should a source of electric charge come in contact with the outside surface of a tray or package made of the multilayered material, the outer layer will conduct the current to a point on the outer surface where the current may leave the material. The relatively higher resistance of the inner antistatic layer impedes current flow through that layer and into components which may be present on the other side.

The multilayer materials can be used in other applications where a gradient in electrical properties is desired. Changes in the in concentration of fibrils can lead to changes in both the conductivity and the permittivity of the resulting composite. Other applications include: dielectric lenses made of layers with different levels of carbon fibrils; field limiting insulation layers for cables or electronic parts; and selective shielding or EMI bandpass filters for cables or signal carrying lines.

In these examples, the different levels of carbon fibrils in the layers asymmetrically modifies the flow of current or charge perpendicular to the layers or modifies electrical fields.

DETAILED DESCRIPTION OF THE INVENTION

Figure 1:
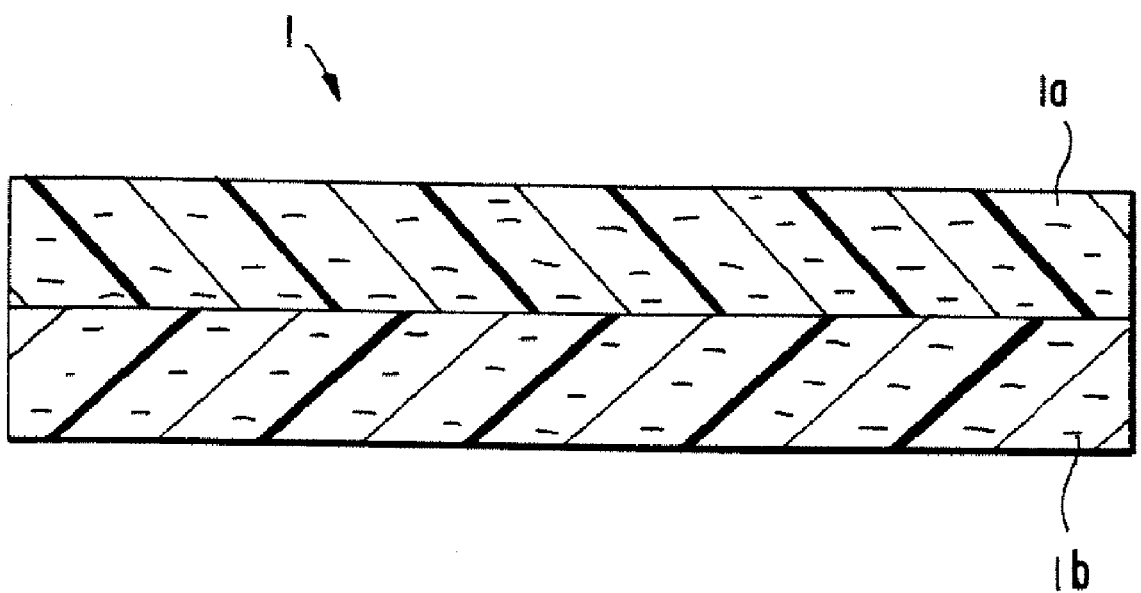
FIG. 1 shows a cross-section of a two layer polymeric material according to the invention.

In a preferred embodiment of the invention, the material has two layers, as shown in the cross-sectional view of FIG. 1. The polymeric material 1 of the invention is a composite of a first layer 1a and a second layer 1b, each layer being a mixture of carbon fibrils in a polymer. The electrical resistance of each polymeric composition is inversely related to the concentration of fibrils in the composition, i.e., the higher the concentration of fibrils, the lower the electrical resistance of the composition. Therefore, the first layer 1a of polymeric material, with a 2.5% by weight concentration of carbon fibrils, has a surface resistance of about $1 \times 10^7$ ohms per square. The second layer 1b, having a fibril concentration of 5.0% has a surface resistance of only about $1 \times 10^4$ ohms per square.

Carbon fibrils are typically in the form of vermicular tubes with graphitic outer layers disposed substantially concentrically about the cylindrical axis of the fibril. Preferably, the fibrils are substantially free of a pyrolytically deposited thermal carbon overcoat.

Carbon fibrils have a length-to-diameter ratio of at least 5, and more preferably at least 100. Carbon fibrils are carbon filaments having diameters less than 500 nanometers. Even more preferred are fibrils whose length-to-diameter ratio is at least 1000. The wall thickness of the fibrils is about 0.1 to 0.4 times the fibril external diameter which is preferably between 3.5 and 75 nanometers. In applications where high strength fibrils are needed, e.g., where the fibrils are used as reinforcements, the external fibril diameter is substantially constant over its length.

Generally, preferred classes of polymers used for this invention include thermosets, thermoplastics, elastomers and inorganics. Certain polymeric alloys, defined as two or more miscible or partially miscible polymers, and blends, defined as discrete non-miscible phases, are also preferred. Specific examples of thermosets and elastomers include polyurethanes, natural rubber, synthetic rubber, epoxy, phenolic, polyesters, polyamides, and silicones. Specific examples of thermoplastics include polyacetal, polyacrylic, acrylonitrile-butadiene-styrene, polycarbonates, polystyrenes, polyethylene, styrene acrylonitrile, polypropylenes, polyethylene terephthalate, polybutylene terephthalate, polyamide (6, 6/6, 6/10, 6/12, 11 or 12), polyamide-imides, polyarylates, polyurethanes, thermoplastic olefins (i.e., polypropylene/impact modifiers such as ethylene, propylene and rubber), thermoplastic elastomers, polyarylsulfone, polyethersulfone, polyphenylene sulfide, polyvinyl chloride, chlorinated polyvinyl chloride, polysulfone, polyetherimide, polytetrafluoro ethylene, fluorinated ethylene propylene, perfluoroalkoxy, polychlorotrifluoro ethylene, ethylene tetrafluoro ethylene, polyvinylidene fluoride, polyvinyl fluoride, polyetherketone, polyether etherketone and polyether ketone ether ketone. Specific examples of alloys and blends include acrylonitrilebutadiene-styrene/polyamide, polycarbonate/acrylonitrile-butadiene-styrene, acrylonitrile butadiene styrene/polyvinyl chloride, polyphenylene ether/polystyrene, polyphenylene ether/polyamide, polysulfone/acrylonitrile-butadiene-styrene, polycarbonate/thermoplastic urethane, polycarbonate/polyethylene terephthalate, thermoplastic elastomer alloys, polyamide/elastomers, polyester/elastomers, polyethylene terephthalate/polybutyl terephthalate, acetal/elastomer, styrene-malefic-anhydride/acrylonitrile-butadiene-styrene, polyether etherketone/polyethersulfone, polyethylene/polyamide and polyethylene/acetal. Specific examples of inorganic polymers include phosphorus based compounds and silicons.

In a preferred embodiment of the invention, the polymer comprises a blend of polymers possessing advantageous properties and a compatibilizer or a compatibilizer with a modifying resin for facilitating the blending of the polymers. Specific examples of such blends include polyphenylene ethers (PPE) or polyphenylene oxides (PPO) with polyamides (e.g., nylons) or polycarboxylic reactants. Examples of such polymer blends with compatibilizers or compatibilizers and modifying agents are described in U.S. Pat. Nos. 4,988,775 and 5,132,365 and in European Patent Application Nos. 90124310.5, 90300841.5, 91112496.4 and 92109100.5.

The polymeric compositions comprising each of the various layers of the multilayered structure of this invention are made by known methods, such as those described in U.S. Pat. Nos. 5,643,502, 5,651,922 and 5,591,382 to Nahass et al. U.S. Pat. Nos. 5,591,382; 5,651,922; and 5,643,502 all to Nahass et al. disclose a polymeric composition having improved toughness and conductivity which includes carbon fibrils, at least a portion of which are in the form of aggregates, substantially all of which aggregates are less than 35 pm in diameter. A method for preparing this polymeric composition is also disclosed. The method includes mixing the carbon fibrils, most of which are in the form of aggregates, with a polymeric material by applying shear to break down the aggregates and distribute them in the polymeric material until substantially all of the aggregates are less then 35 pm in diameter. The patents to Nahass et al. are incorporated herein by reference as if set forth in full.

One method of combining layers 1a and 1b involves first shaping each of the compositions into individual flat sheets and allowing the sheets to cure. After curing, the sheets are pressed together under conditions of high heat and pressure, causing them to fuse to one another. Conductive adhesives may also be used to join separate sheets of polymeric composition to one another.

Another method is to insert or over-mold the two layers. In this process an injection molding machine is used to mold the first layer. The resultant part is then placed into a second mold where the second layer is then molded onto the first. The heat from the second layer causes a melt-bond to form between the first and second layers. In this way the layers are cured sequentially. The same effect can also be achieved using a special two-shot or multi-shot molding machine. This is an apparatus that has two or more barrels that inject polymeric materials into the same mold. Materials with different conductivities are placed in different barrels and injected into the mold separately to form a two or more layered part.

Figure 3:
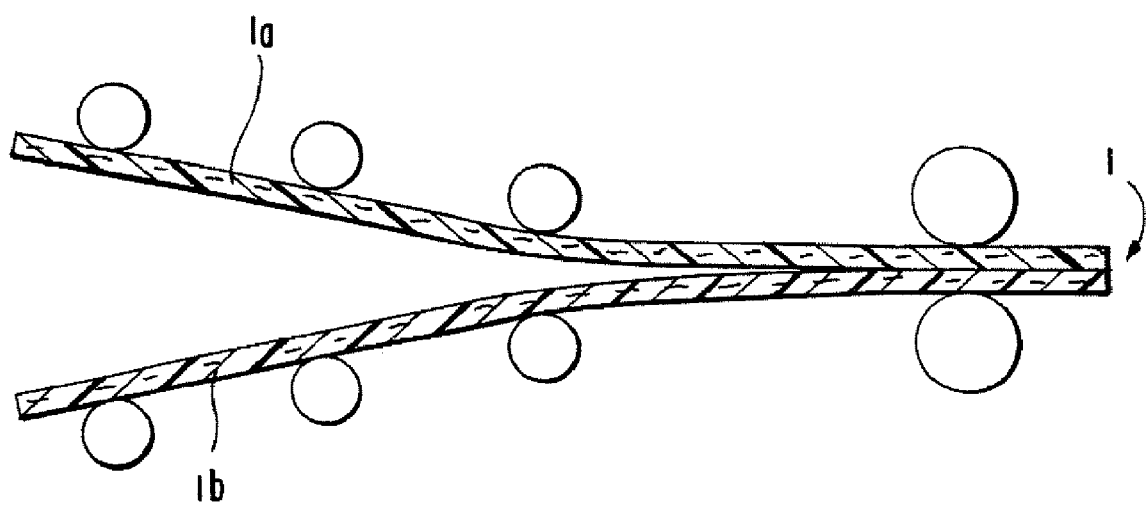
FIG. 3 shows two layers made of polymeric compositions having fibrils therein being combined to form the two layer conductive polymeric material of FIG. 1.

Once the polymeric compositions constituting each of the layers of the multilayered polymer structure are prepared, they are preferably combined in a coextrusion process as schematically depicted in FIG. 3.

In this preferred process, two or more viscous materials are combined into a multilayered product. The polymeric compositions of the first and second layers 1a and 1b are forced through an aperture before either composition has had a chance to cure. This forms a multilayered sheet of polymeric compositions which can be placed in a mold. A similar process can be used to coextrude multilayer tubes or jackets for cables or wires.

Figure 2:
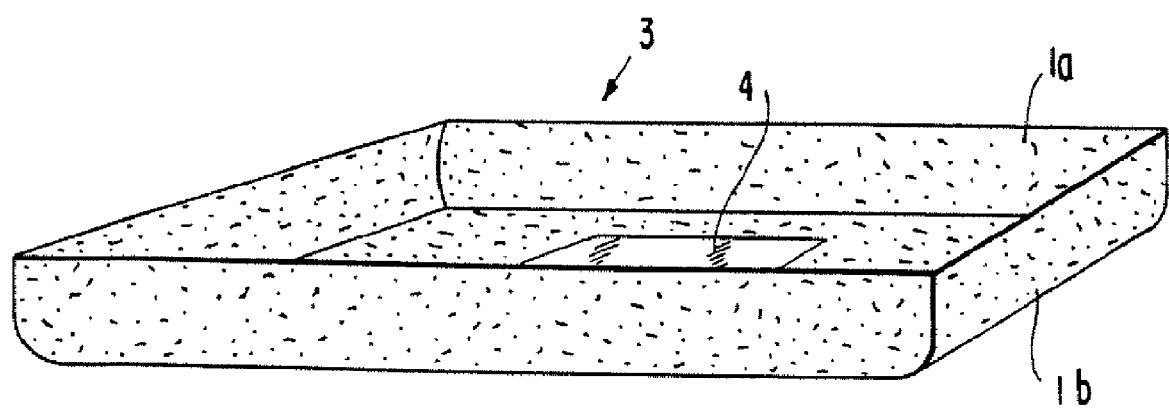
FIG. 2 shows a tray made from the two layer polymeric material of FIG. 1.

FIG. 2 shows a tray 3 made from the multilayered material of this invention. The first layer 1a of the material forms the inside antistatic surface of the tray 3. A carbon fibril concentration of 2.5% by weight provides the inside layer with a surface resistance of about $1 \times 10^7$ ohms per square. The high level of surface resistance of the inside layer 1a allows for the slow dissipation of any electro-static charge which may build on components present inside the tray 3. This charge is dissipated through the outer layer 1b which is in electrical contact with the inner layer 1a.

The second layer 1b forms the outside surface of the tray 3 and has a surface resistance of about $1 \times 10^4$ ohms per square. The second layer contains about 5% by weight of carbon fibrils, and due to the lower resistance of layer 1b relative to 1a, layer 1b reduces the risk of electrical charge flowing from outside the tray into the tray and damaging components therein. Layer 1b acts as a shunt guiding current away from the sensitive components inside the tray. Item 4 in FIG. 2 represents an electrical component which can be carried by using tray 3.

The multilayered polymeric material of this invention may be formed into any shape or configuration including trays, packages, boxes, and the like by injection molding, blow molding, RIM, or any other method commonly known for shaping polymeric materials. The antistatic properties of the packaging material of the invention are measured according to the procedure described in ASTM D-257.

EXAMPLES

The following examples serve to provide further appreciation of the invention but 5 are not meant in any way to restrict the effective scope to the invention.

Examples 1-9

Masterbatch compositions containing 15% fibril loading were prepared according to methods described in the examples section of U.S. Pat. No. 5,651,922 to Nahass et al. incorporated herein by reference. Masterbatch formulations were prepared having 15% by weight carbon fibrils obtained from bird's nest (BN) aggregates and 85% polyethylene terephtalate modified with cylcohexanedimethanol (PETG). Other masterbatch compositions included 15% by weight carbon fibrils from bird's nest type aggregates and 85% polybutylene terephtalate (PBT). Yet other masterbatch composition were prepared to include 15% by weight carbon fibrils from bird's nest type aggregates and 0.5% by weight polytetrafluoroethylene (PTFE) and the balance PETG.

The above masterbatch compositions were used to make other formulations as listed in Table 1 below. For example, to make a PETG/SBN product 33.5% PBT/15BN was mixed with 66.7% PETG polymer. PBT and PETG trans-esterify to form a hybrid mixture of two polymers with a single flow transition temperature and are crystalline in nature. The impact modifier (IM) used in these formulations was rubber. For example, formulation 7 of table 1 contains 2% by weight impact modifier, 5% by weight carbon fibrils from bird's nest aggregates and a hybrid mixture of 28 wt % PBT and 65 wt % PETG. Electrical properties for each formulation, such as volume and surface resistivity were measured and are listed for each formulation in Table 1 below.

TABLE 1

| Example | Formulation | Masterbatch | Volume Resistivity ohm-cm | Surface Resistivity ohm/square |
|---|---|---|---|---|
| 1 | PETG/2IM/5BN | PETG/15BN | 6.63E+02 | 2.86E+05 |
| 2 | PETG/4 IM/SBN | PETG/15BN | 5.80E+02 | 7.71E+06 |
| 3 | PETG/6 IM/5BN | PETG/15BN | 9.30E+02 | 8.00E+06 |
| 4 | PETG/2IM/5BN | PETG/0.5PTFE/15BN | 2.30E+03 | 1.90E+06 |
| 5 | PETG/4IM/5BN | PETG/0.5PTFE/15BN | 6.80E+02 | 3.70E+06 |
| 6 | PETG/6IM/SBN | PETG/O.SPTFE/15BN | 1.40E+02 | 4.00E+06 |
| 7 | PETG/2IM/5BN | PBT/15BN | 1.00E+02 | 3.90E+05 |
| 8 | PETG/4IM/5BN | PBT/15BN | 8.74E+02 | 1.17E+07 |
| 9 | PETG/6IM/5BN | PBT/15BN | 8.46E+02 | 8.57E+04 |

Figure 4:
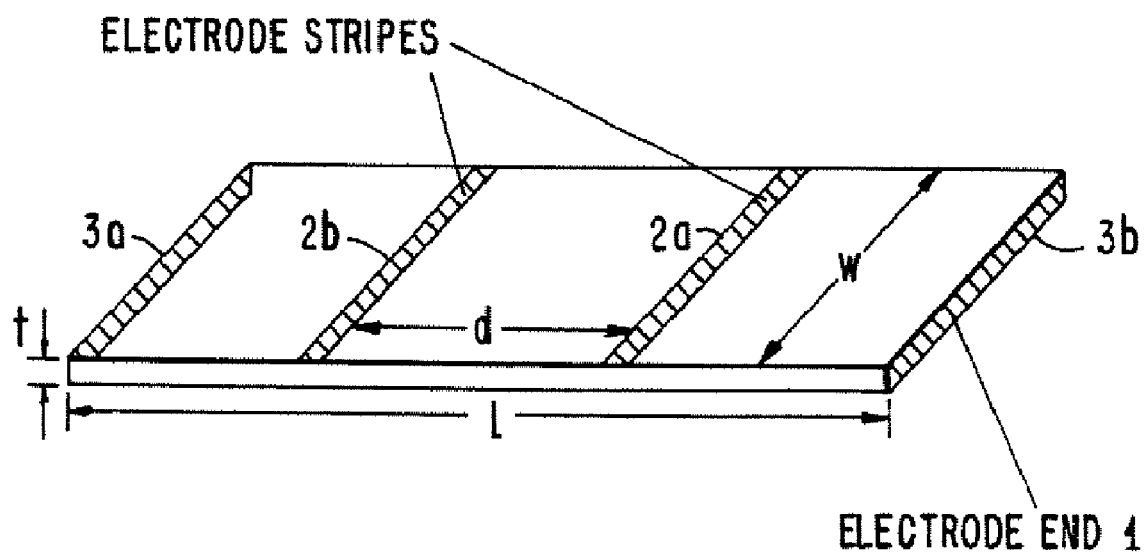
FIG. 4 is a test set-up diagram of a molded tensile bar utilized for measuring DC resistance through the volume of samples in example 1 to 9.

DC resistance through the volume of the samples was measured at 2 volts and converted to volume resistivity using the formula shown with the test set-up diagram in FIG. 4. Electrodes were painted on each end 1 of injection molded tensile bars with silver conducting paint after cutting away the tabs from each end. The leads of a multi-meter were then contacted with the silver paint electrode strips 2a and 2b on the sample in order to obtain surface resistivity measurements and with the silver paint electrode strips 3a and 3b in order to obtain volume resistivity measurements. In FIG. 4, d is the electrode spacing for surface resistivity test, 1 is the electrode spacing for volume resistivity test, w is the electrode width and t is the sample thickness, all values are measured in centimeters. Based on the foregoing variables, the surface and volume resistivity are calculated as follows:

surface resistivity (ohm/square)=resistance[ohm]/($d$ [cm]/$w$ [cm])

volume resistivity (ohm-cm)=resistance[ohm]×$t$ [cm]/(1 [cm]/$w$ [cm])

Discussion of Experimental Results

Any one of the formulations above can be combined with another to form a bilayered polymeric structure useful in forming the packaging material of the present invention. For example, a bilayered polymeric structure can be made by coextrusion or lamination with a conductive adhesive between the layers by overmolding or by two-shot molding. The resulting bilayered structure is then thermoformed into a tray wherein the layer prepared from composition 1 is the inside layer having the higher surface resistivity.

Although the invention has been described with reference to specific examples, they should not be construed as limiting since they are merely illustrative of the invention. One of skill in the art may alter the described examples without departing from the spirit or scope of the invention

We claim:

1. A process for making a multilayered polymeric structure for protecting an electronic component which comprises:

forming at least a first inner polymeric layer comprising carbon fibrils and a second outer polymeric layer comprising carbon fibrils, each layer comprising a different amount of carbon fibrils; and combining said first and second polymeric layer to form said multilayered polymeric structure, wherein said first inner polymeric layer has a higher surface resistance than said second outer polymeric layer, and further wherein said electronic component is in contact with said first inner polymeric layer.

2. The process according to claim 1, wherein said layers are combined by a process selected from the group consisting of coextrusion, and two shot or multi-shot injection molding, and insert injection molding.

3. The process according to claim 1, further comprising molding said multilayered polymeric structure to shape said multilayered polymeric structure.

4. The process according to claim 1, wherein said first and second polymeric layers comprise individual solid sheets.

* * * * *